US 6,605,492 B2

(12) United States Patent
Barrett

(10) Patent No.: US 6,605,492 B2
(45) Date of Patent: *Aug. 12, 2003

(54) PLASTIC BALL GRID ARRAY ASSEMBLY

(75) Inventor: Joseph C. Barrett, El Dorado, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 3 days.

(21) Appl. No.: 09/527,284

(22) Filed: Mar. 17, 2000

(65) Prior Publication Data
US 2002/0048845 A1 Apr. 25, 2002

Related U.S. Application Data

(62) Division of application No. 08/986,275, filed on Dec. 5, 1997, now Pat. No. 6,064,117.

(51) Int. Cl.⁷ .......................... H01L 21/44; H01L 21/48; H01L 21/50; H01L 23/12; H01L 23/04
(52) U.S. Cl. .................. 438/126; 438/108; 438/127; 257/704; 257/730; 257/778; 257/787
(58) Field of Search .................. 438/126, 127, 438/108, 112, 116, 118, 15; 257/704, 730, 777, 778, 782, 787; 264/272.17

(56) References Cited

U.S. PATENT DOCUMENTS

| 4,915,607 | A | * | 4/1990 | Medders et al. ............ 425/116 |
| 5,708,300 | A | | 1/1998 | Woosley et al. |
| 5,732,465 | A | * | 3/1998 | Tokita et al. ................. 29/841 |
| 5,886,398 | A | | 3/1999 | Low et al. |
| 5,933,324 | A | | 8/1999 | Barrett |
| 6,060,777 | A | | 5/2000 | Jamieson et al. |
| 6,064,117 | A | | 5/2000 | Barrett |
| 6,130,383 | A | * | 10/2000 | Lamourelle ................ 174/52.4 |
| 6,310,298 | B1 | | 10/2001 | Barrett et al. |
| 2002/0001874 | A1 | | 1/2002 | Barrett |

* cited by examiner

Primary Examiner—Olik Chaudhuri
Assistant Examiner—Neal Berezny
(74) Attorney, Agent, or Firm—Blakely, Sokoloff, Taylor & Zafman LLP

(57) ABSTRACT

An apparatus for enclosing logic chips includes a substrate upon which a logic chip is mounted and a mold cap disposed upon the substrate and covering the logic chip. The mold cap includes at least one extension of sufficient size and shape to provide structural support to a corner section of the substrate.

22 Claims, 5 Drawing Sheets

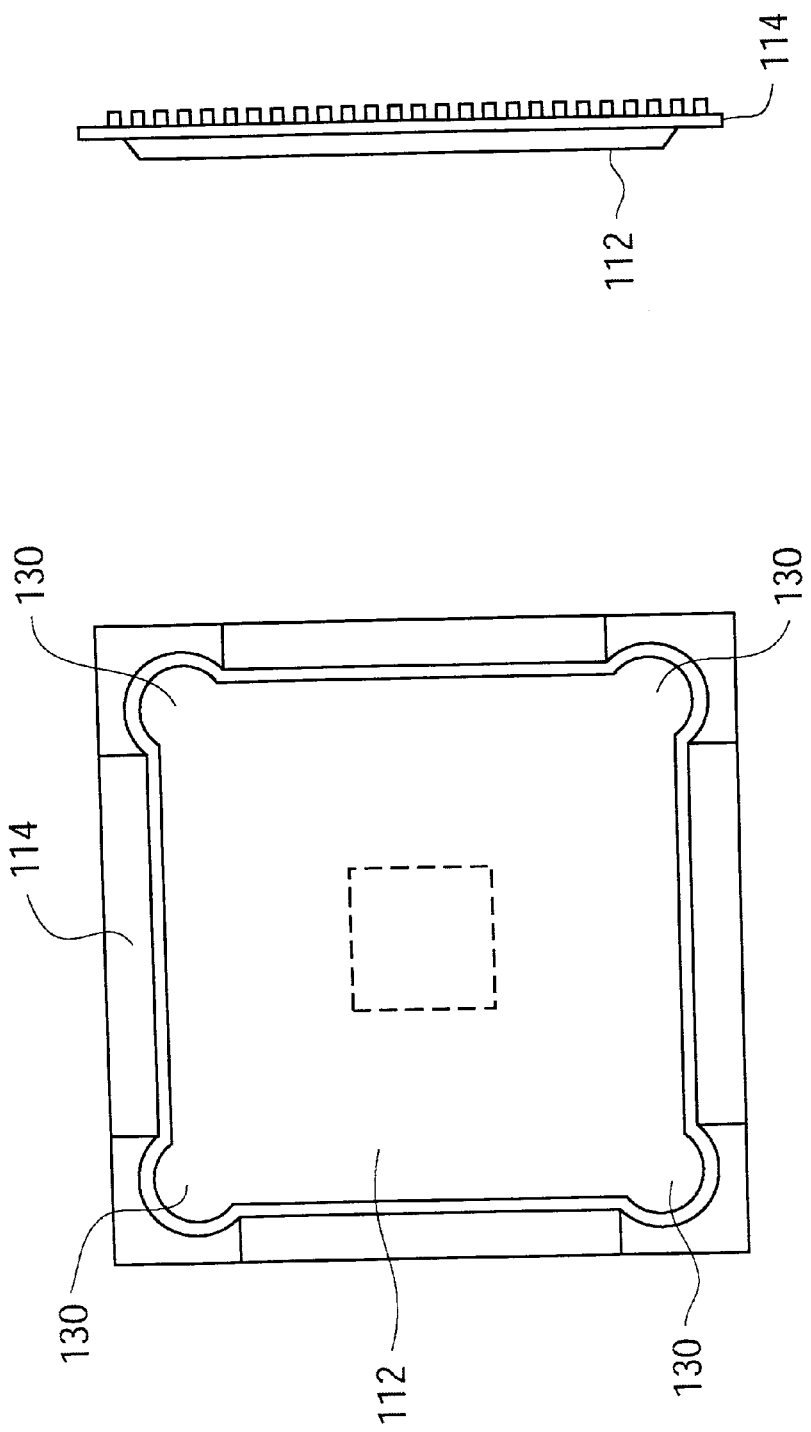

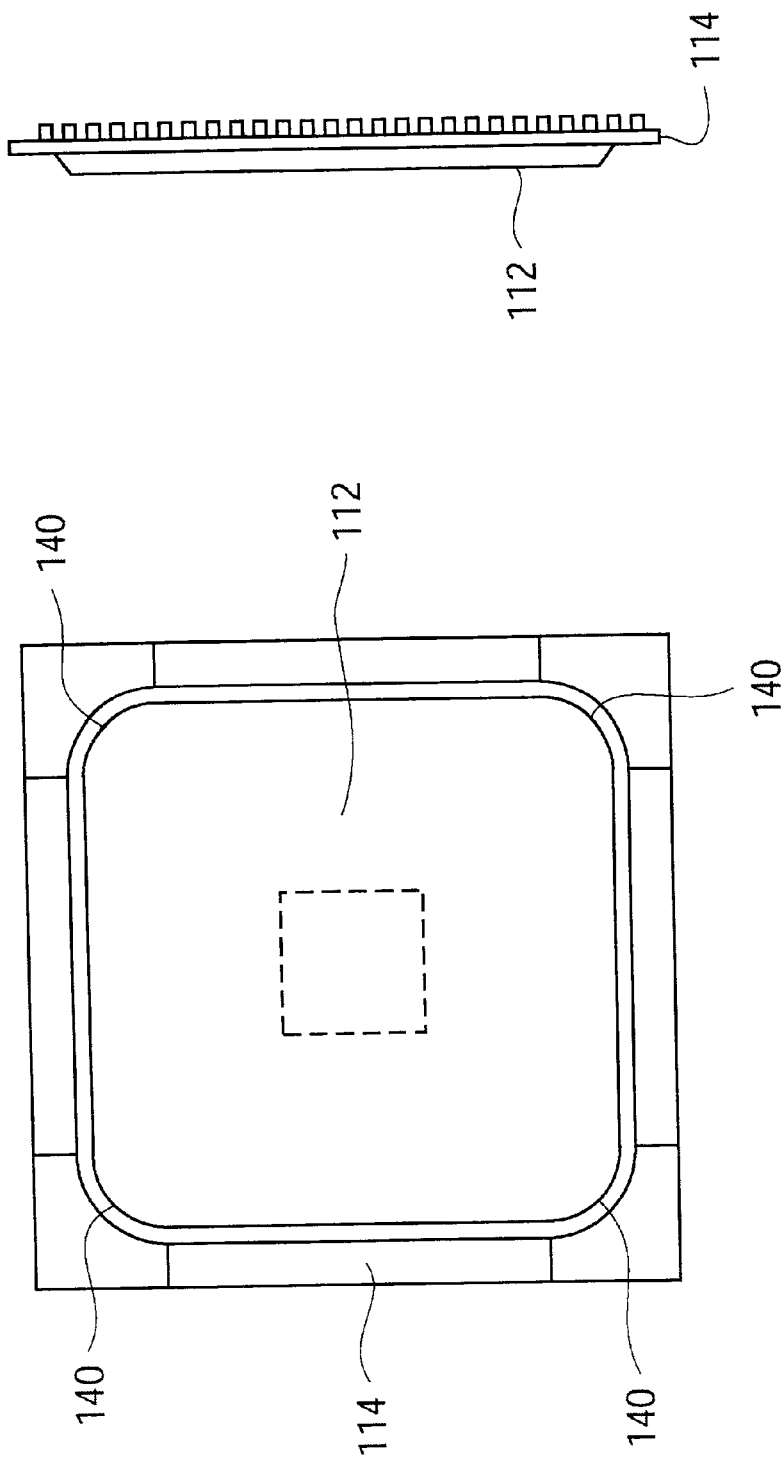

PLASTIC BALL GRID ARRAY ASSEMBLY

This application is a divisional patent application of U.S. patent application Ser. No. 08/986,275, filed Dec. 5, 1997, now U.S. Pat. No. 6,064,117.

BACKGROUND OF THE INVENTION

1. Field of the Invention

This invention relates generally to a plastic ball grid array ("PBGA") assembly, and more particularly, to an improved PBGA assembly including strengthened corner sections.

2. Description of the Related Art

A PBGA assembly is a package for enclosing semiconductor logic chips. PBGA assemblies are designed to increase the number of paths available for delivering signals to and from the logic chips. For example, conventional semiconductor packages commonly have a single row of pins disposed about their outside edge. Whereas PBGA assemblies employ the larger surface area under the PBGA assembly to connect signals to the internal logic chips, e.g., a plurality of solder balls spaced about the bottom surface area are used for the transfer of signals.

A PBGA assembly generally comprises two parts: a substrate and an overmold. During assembly of the package, the logic chip or die is glued, or otherwise attached, to the top of the substrate. The overmold is then molded on the substrate over the die to form a protective covering.

The substrate is a relatively thin member, commonly having a thickness of about 0.36 to about 0.65 millimeters thick. Further, the substrate can include printed circuit traces, dielectric material, and solder balls. Typically, the substrate is either square or rectangular in shape, and is relatively flexible. Substrates generally range in sizes from about 27 to about 50 millimeters in width and in length. Overall, substrates are relatively fragile devices, prone to damage if not protected.

A typical PBGA assembly 10 is shown in FIGS. 1A and 1B. The assembly 10 includes a mold cap 12 disposed upon a substrate 14. The mold cap 12 includes chamfered side edges 16 and chamfered corners 18. Disposed beneath the substrate 14 are a plurality of solder balls 20 for use in connecting the PBGA assembly 10 to a printed circuit board (not shown), and in transferring signals to and from a logic chip 22 mounted on the substrate 14 and covered by the mold cap 12.

The solder balls 20 disposed along the bottom of the substrate 14 provide the connections between the PBGA assembly 10 and the printed circuit board. Installation of the PBGA assembly 10 onto the printed circuit board is relatively straight forward. The PBGA assembly 10 is heated during installation to a relatively high temperature so that the solder balls 20 melt and the PBGA assembly 10 in effect solders itself to the printed circuit board.

The mold cap 12 comprises a mold compound of sufficient thickness to form a protective covering over the die 22 (typically, about 0.8 millimeters thick). Typically, the mold compound is a thermoset plastic compound, and is used to protect the die 22 from environmental conditions. The mold cap 12 extends over all but the four side edges of the substrate 14, so that the edges of the substrate 14 remain free for clamping during the. molding operation (e.g., to hold the substrate 14 in place proximate the mold during the overmolding process when plastic is injected into the mold), and during subsequent processing, handling and installation. The edges 16 of the mold cap 12 are chamfered to facilitate removal from the mold. The mold cap edges 16 define an acute angle and are designed to ease the separation of the mold cap 12 from the mold. The mold cap 12 also typically includes chamfered corners 18. Thus, the corner sections 19 of prior PBGA assemblies 10 are unsupported, and generally consist of only the substrate 14.

As a result of this construction, the corner sections 19 of prior PBGA assemblies 10 are susceptible to mechanical damage. The flexible corner sections 19 are easily damaged, for example, during processing associated with the assembly, test, and installation of the PBGA assemblies 10, and during normal handling.

The present invention is directed to overcoming, or at least reducing the effects of, one or more of the problems set forth above.

SUMMARY OF THE INVENTION

In one aspect of the present invention, an apparatus for enclosing a logic chip is provided. The apparatus includes a substrate, which has a surface adapted to receive the logic chip mounted thereon. Further, a mold cap is disposed upon the substrate, and the mold cap extends at least partially over the logic chip. The mold cap also includes at least one extension of a preselected size and shape that extends at least partially into a corner section of the substrate.

In another aspect of the present invention, a method is provided for enclosing a logic chip. The method includes mounting the logic chip on a polygon shaped substrate, and forming a mold cap on the substrate extending at least partially over the logic chip and into a corner section of the substrate.

BRIEF DESCRIPTION OF THE DRAWINGS

Other objects and advantages of the invention will become apparent upon reading the following detailed description and upon reference to the drawings in which:

FIGS. 3A and 3B illustrate a top and side view of a second exemplary plastic ball grid array assembly in accordance with the present invention;

FIGS. 4A and 4B illustrate a top and side view of a third exemplary plastic ball grid array assembly in accordance with the present invention.

Figure 1A:
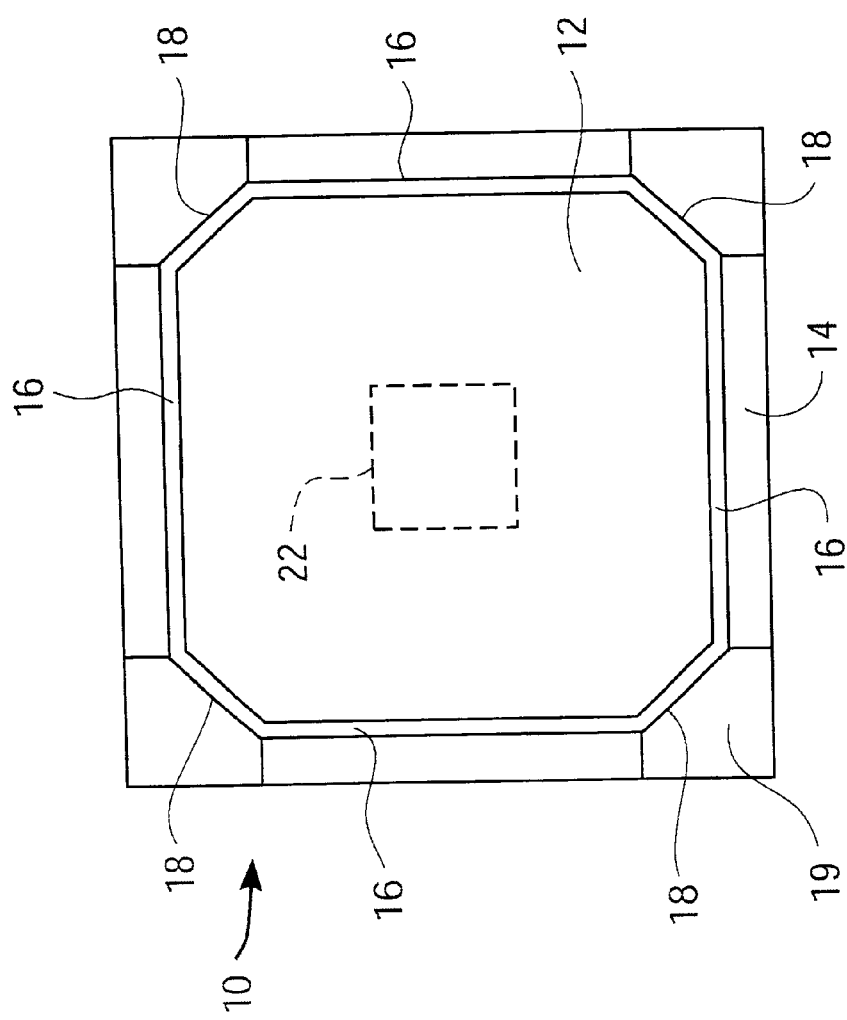
FIGS. 1A and 1B illustrate a top and side view of a prior art plastic ball grid array assembly.
Figure 1B:
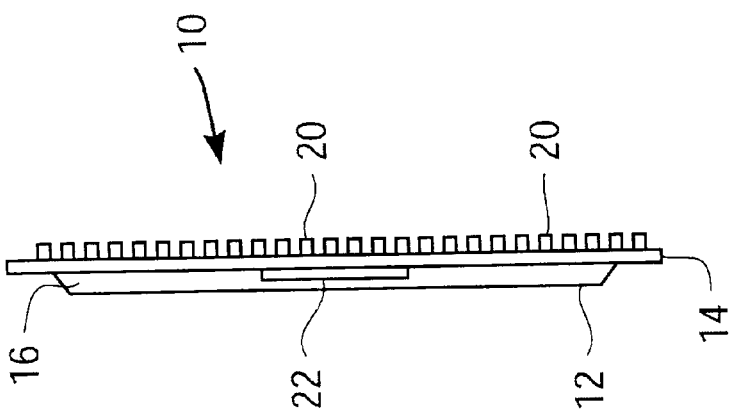

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

A PBGA assembly is provided in which mold compound is selectively extended into corner sections of the assembly to reinforce the corners by adding the strength of the mold compound extension to that of the substrate material. Extending mold compound completely to all of the assembly perimeter edges generally would result in excessive warpage of the assembly during the molding process. However, by selectively extending the mold compound into the assembly sections to be reinforced, the overall strength of the assembly is improved without the undesirable warpage. The strengthening is due in part to the increase in the average effective thickness of the corner sections and to the increased support resulting from the shape of the extension itself. Further, by only selectively extending the mold compound into the corner sections, warpage problems are avoided, and at least portions of the assembly edges are left available for clamping, e.g., during the molding operation.

Figure 2B:
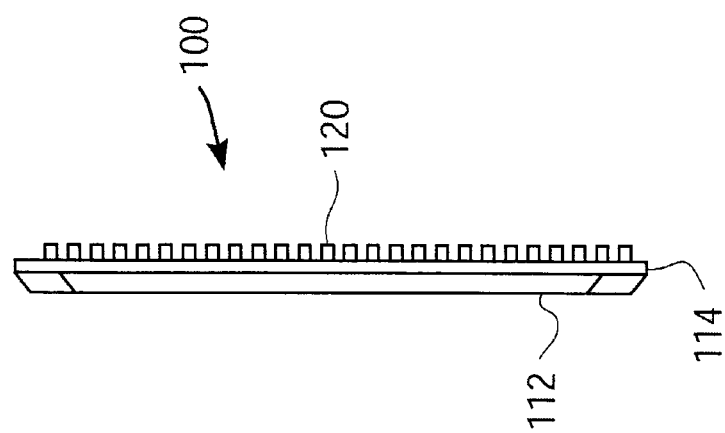
FIGS. 2A and 2B illustrate a top and side view of a first exemplary plastic ball grid array assembly in accordance with the present invention.
Figure 2A:
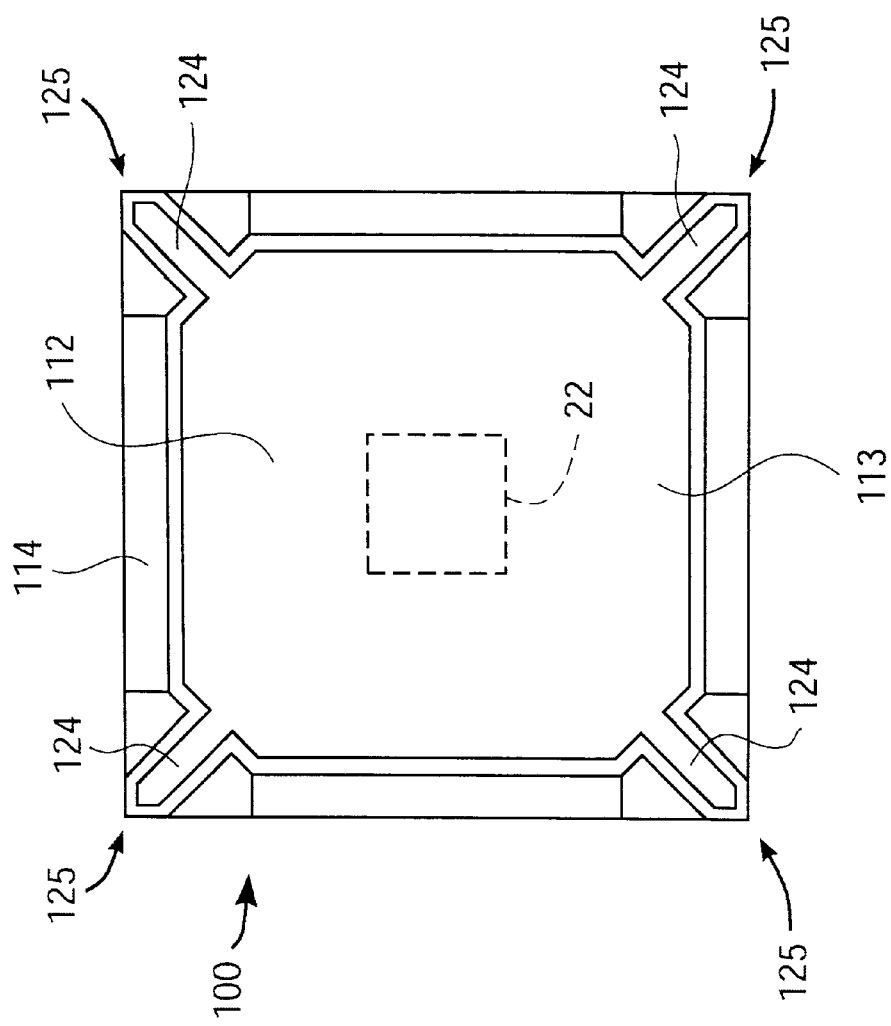

Turning now to the drawings and referring initially to FIGS. 2A and 2B, in a first embodiment of the present invention, a relatively narrow rib 124 of mold compound extends into each corner area 125 for reinforcement. This configuration of a PBGA 100 generally provides for increased reinforcement of the assembly corner area 125. In accordance with the present invention, the PBGA 100 includes a polygon shaped substrate 114 (e.g., square, rectangular, or the like), a mold cap 112, and solder balls 120. The mold cap 112 is comprised of a main body 113 covering the logic chip 22 and a plurality of extensions 124 comprising rib structures that help to strengthen the corners of the substrate 114. The edges of the mold cap 112, including both the main body 113 and the extensions 124, have chamfered edges to facilitate removal of the mold cap 112 from the mold (not shown). During the molding process, a thermoset plastic, such as SMTB-1 available from Amoco Plaskon, is injected into an appropriately shaped mold, as is conventional in the art.

In the embodiment illustrated in FIGS. 2A and 2B, the extensions 124 extend to the edge of the substrate 114. The size and shape of the extensions 124 may vary, however, depending upon the circumstances associated with a particular desired application of the present invention. It is contemplated, however, that the size and shape of a particular extension 124 will be determined at least in part based upon: the desired amount of additional strength to be gained for the package corners; the desire to avoid excessive part warpage during the molding operation due to, e.g., uneven shrinkage between the mold compound and the substrate material; and the need to preserve compatibility of the package design with the requirements of the molding process.

The rib extensions 124 are of such size and shape as to provide a desired amount of reinforcement to the corners of substrate 114 for a particular application. Thus, in accordance with the present invention, the rib extensions 124 need not necessarily extend fully to the side edge or corner of the substrate 114. See, e.g., FIGS. 3A, 3B, 4A and 4B. In alternative embodiments of the present invention, the corner sections of the substrate 114 may be reinforced by adapting the mold cap 112 to include radiused extension structures 130 (see FIG. 3A), full radius corners 140 (see FIG. 4A), or extensions of some other suitable shape. It should be appreciated that reinforcing extensions 130, 140 of the type shown in FIGS. 3A and 4A will provide less strength and reduced warpage as compared to the extensions 124 shown in FIG. 2A.

Figure 5:
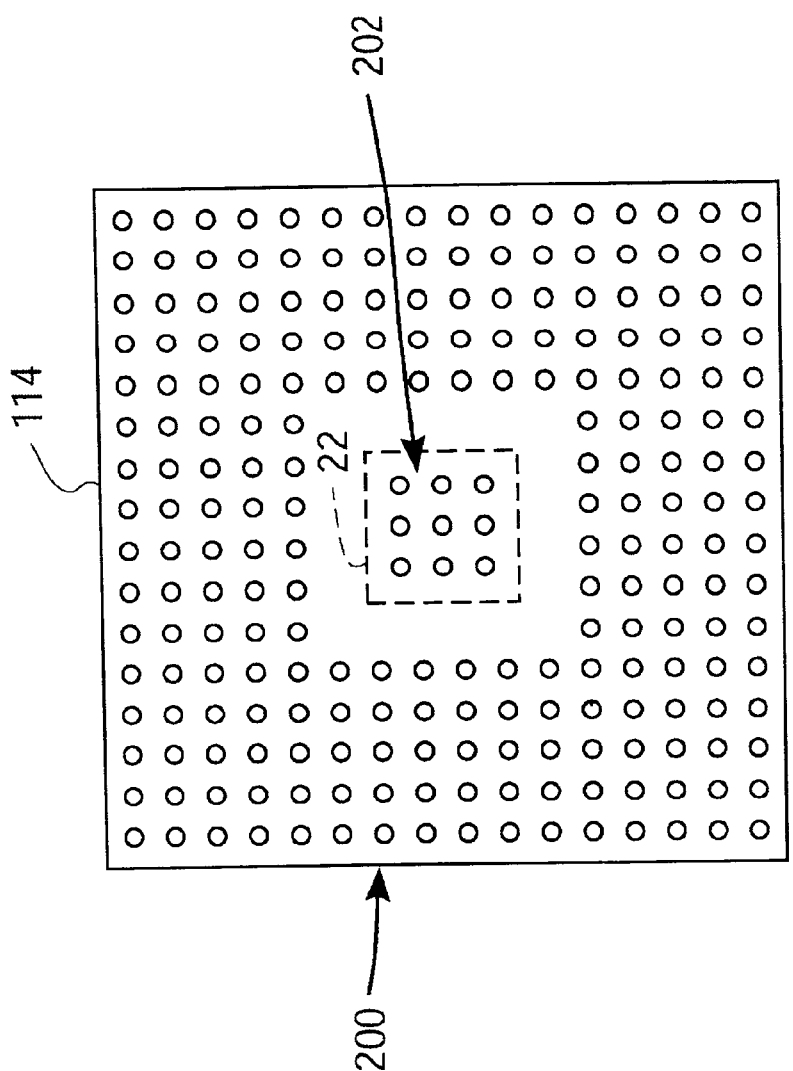
FIG. 5 illustrates a bottom view of an exemplary plastic ball grid array assembly in accordance with the present invention.

Although the solder balls 120 can be located across the entire lower surface of the substrate 114, in accordance with one embodiment of the present invention, the solder balls 120 are spaced from the areas directly b[]neath the edges of the die 22. Shear stress tends to be the greatest during temperature cycling in the area directly beneath the edges of the die 22, and thus, after a relatively few number of thermal cycles, the solder balls 120 tend to fail. However, beneath the die 22 but spaced from the edges thereof, the solder balls 120 can also serve as a heat transfer path into the printed circuit board. Thus, in one embodiment depicted in FIG. 5, about five rows 200 of solder balls 120 are disposed generally around the edges of the substrate 114. Additionally, a plurality of central solder balls 202 are spaced from the peripheral solder balls 200, lying directly below the die 22, but spaced from the edges of the die 22. The central solder balls 202 can be used for transferring electrical signals and/or heat transfer. Alternatively, the central solder balls 202 can be eliminated, leaving only the peripheral solder ball 200.

The particular embodiments disclosed above are illustrative only, as the invention may be modified and practiced in different but equivalent manners apparent to those skilled in the art having the benefit of the teachings herein. Furthermore, no limitations are intended to the details or construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method comprising:
   mounting a logic chip on a substrate; and
   forming a mold cap over the substrate such that the mold cap at least partially covers the logic chip, the forming comprising forming the mold cap with a plurality of extensions each extending into a respective corner section of the substrate for reinforcement without extending to an edge of the substrate.

2. The method of claim 1, wherein the forming comprises forming the mold cap with a plurality of rib structures each extending into a respective corner section of the substrate.

3. The method of claim 1, wherein the forming comprises forming the mold cap with a plurality of rounded structures each extending into a respective corner section of the substrate.

4. The method of claim 1, wherein the forming comprises forming the mold cap with a plurality of rounded corners each extending into a respective corner section of the substrate.

5. The method of claim 1, wherein the forming comprises forming the mold cap with chamfered edges.

6. The method of claim 1, comprising forming a plurality of solder balls on a surface of the substrate opposite the mold cap.

7. The method of claim 6, comprising forming a plurality of solder balls on the surface of the substrate in an area directly opposite the logic chip.

8. The method of claim 6, comprising forming the plurality of solder balls on the surface of the substrate such that all solder balls on the surface of the substrate are spaced from areas on the surface of the substrate directly opposite an edge of the logic chip.

9. The method of claim 1, wherein the forming comprises forming the mold cap with at least one rib structure that extends into a respective corner section of the substrate without extending to an edge of the substrate.

10. The method of claim 1, wherein the forming comprises forming the mold cap with at least one rounded structure that extends into a respective corner section of the substrate without extending to an edge of the substrate.

11. The method of claim 1, wherein the forming comprises forming the mold cap with at least one rounded corner that extends into a respective corner section of the substrate without extending to an edge of the substrate.

12. A method comprising:

mounting a logic chip on a substrate; and forming a mold cap over the substrate such that the mold cap at least partially covers the logic chip, the forming comprising forming the mold cap with a rounded extension extending into a corner section of the substrate for reinforcement of the substrate.

13. The method of claim 12, wherein the forming comprises forming the mold cap with a rounded corner extending into the corner section of the substrate.

14. The method of claim 12, wherein the forming comprises forming the mold cap such that the rounded extension extends into the corner section of the substrate without extending to an edge of the substrate.

15. The method of claim 12, wherein the forming comprises forming the mold cap with chamfered edges.

16. The method of claim 12, comprising forming a plurality of solder balls on a surface of the substrate opposite the mold cap.

17. The method of claim 16, comprising forming a plurality of solder balls on the surface of the substrate in an area directly opposite the logic chip.

18. The method of claim 16, comprising forming the plurality of solder balls on the surface of the substrate such that all solder balls on the surface of the substrate are spaced from areas on the surface of the substrate directly opposite an edge of the loge chip.

19. The method of claim 12, wherein the forming comprises forming the mold cap with a plurality of rounded extensions each extending into a respective corner section of the substrate.

20. The method of claim 19, wherein the forming comprises forming the mold cap with at least one rounded extension that extends into a respective corner section of the substrate without extending to an edge of the substrate.

21. The method of claim 12, wherein the forming comprises forming the mold cap with a plurality of rounded corners each extending into a respective corner section of the substrate.

22. The method of claim 21, wherein the forming comprises forming the mold cap with at least one rounded corner that extends into a respective corner section of the substrate without extending to an edge of the substrate.

* * * * *

UNITED STATES PATENT AND TRADEMARK OFFICE
CERTIFICATE OF CORRECTION

PATENT NO. : 6,605,492 B2
DATED : August 12, 2003
INVENTOR(S) : Barrett

It is certified that error appears in the above-identified patent and that said Letters Patent is hereby corrected as shown below:

<u>Column 4,</u>
Line 12, delete "b[]neath" and insert -- beneath --.

<u>Column 6,</u>
Line 13, delete "loge" and insert -- logic --.

Signed and Sealed this

Fifteenth Day of June, 2004

JON W. DUDAS
*Acting Director of the United States Patent and Trademark Office*